United States Patent
Noda et al.

(10) Patent No.: US 12,000,035 B2
(45) Date of Patent: Jun. 4, 2024

(54) SANITARY EQUIPMENT PART

(71) Applicant: TOTO LTD., Kitakyushu (JP)

(72) Inventors: Yui Noda, Kitakyushu (JP); Saori Ukigai, Kitakyushu (JP); Yuya Suzuki, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 21 days.

(21) Appl. No.: 17/280,675

(22) PCT Filed: Mar. 1, 2021

(86) PCT No.: PCT/JP2021/007682
§ 371 (c)(1),
(2) Date: Mar. 26, 2021

(87) PCT Pub. No.: WO2021/199833
PCT Pub. Date: Oct. 7, 2021

(65) Prior Publication Data
US 2023/0017857 A1    Jan. 19, 2023

(30) Foreign Application Priority Data
Mar. 31, 2020 (JP) .................... 2020-064495

(51) Int. Cl.
*B32B 9/00* (2006.01)
*C23C 14/00* (2006.01)
(Continued)

(52) U.S. Cl.
CPC ............ *C23C 14/083* (2013.01); *B32B 9/005* (2013.01); *C23C 14/0015* (2013.01); *C23C 14/34* (2013.01); *C23C 14/547* (2013.01)

(58) Field of Classification Search
CPC ...................................................... B32B 9/005
(Continued)

(56) References Cited

U.S. PATENT DOCUMENTS

| 2003/0124360 A1 | 7/2003 | Reihs et al. |
| 2007/0082222 A1 | 4/2007 | Sheek et al. |
(Continued)

FOREIGN PATENT DOCUMENTS

| JP | H04-129734 A | 4/1992 |
| JP | 2000-265526 A | 9/2000 |
(Continued)

OTHER PUBLICATIONS

PCT/IB/373 and PCT/ISA/237 of International Application PCT/JP2021/007682.
(Continued)

*Primary Examiner* — Katherine A Christy
(74) *Attorney, Agent, or Firm* — Carrier, Shende & Associates P.C.; Joseph P. Carrier; Fulchand P. Shende

(57) ABSTRACT

A part includes a base material, a colored layer on the base material, and a surface layer on the colored layer, wherein the colored layer contains Zr, and optionally, C and/or N, a ratio ($H_{Zr\ oxide}/H_{Zr}$) of a peak height derived from Zr oxide ($H_{Zr\ oxide}$) to a peak height of Zr ($H_{Zr}$) at an interface of the colored layer on the side of the surface layer is more than 0 and less than 4.5, the interface is a point where Zr is detected by sputtering the part from the side of the surface layer with an XPS depth direction analysis, and the ratio ($H_{Zr\ oxide}/H_{Zr}$) at a point where Ar sputtering is performed for 5 minutes from the interface of the colored layer on the side of the surface layer with the XPS depth direction analysis is 0 to less than 3. The surface layer is water-repellent and exhibits a sputtering time of 5 minutes or less.

18 Claims, 1 Drawing Sheet

(51) Int. Cl.
  *C23C 14/08* (2006.01)
  *C23C 14/34* (2006.01)
  *C23C 14/54* (2006.01)
(58) Field of Classification Search
  USPC .......................................................... 428/469
  See application file for complete search history.

(56) References Cited

U.S. PATENT DOCUMENTS

2010/0227177 A1  9/2010  Shigeru et al.
2015/0010770 A1  1/2015  Evans et al.
2019/0255563 A1  8/2019  Koch

FOREIGN PATENT DOCUMENTS

| JP | 2003-247085 A | 9/2003 |
| JP | 2003-535216 A | 11/2003 |
| JP | 2004-217950 A | 8/2004 |
| JP | 2009-233920 A | 10/2009 |
| JP | 2009-268991 A | 11/2009 |
| JP | 2015-511992 A | 4/2015 |
| JP | 2019-515790 A | 6/2019 |

OTHER PUBLICATIONS

PCT/ISA/210 of International Application PCT/JP2021/007682 with the English translation thereof.

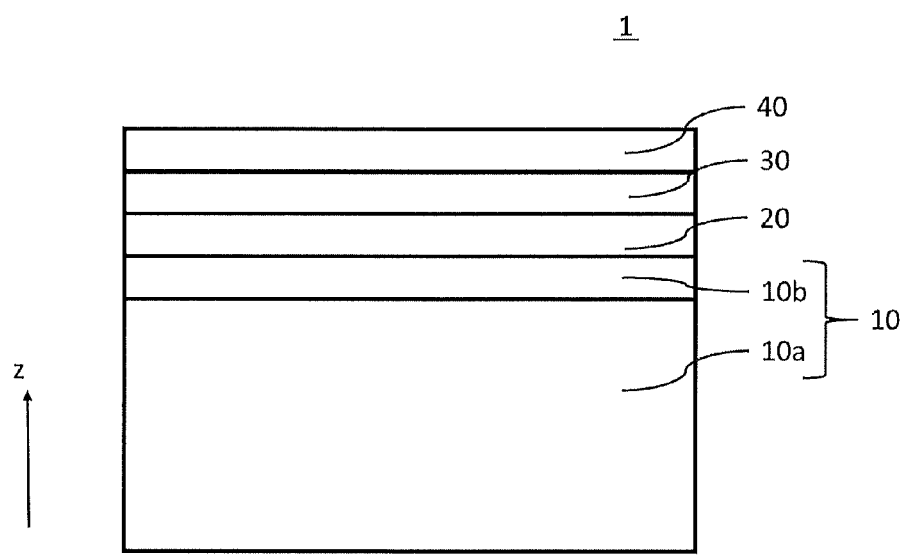

SANITARY EQUIPMENT PART

TECHNICAL FIELD

The present invention relates to a part including a colored layer, and particularly to a part including a colored layer and a water-repellent surface layer.

BACKGROUND ART

Water for domestic use including tap water contains silicon and calcium which cause the formation of scales. In a wet area part that may contact with water for domestic use, it has been required that the adhesion of scales be suppressed or scales once adhered can be easily removed. In one of the known techniques for preventing the adhesion of stains such as scales to the surface of the wet area part or improving the stain removability, the surface of the wet area part is covered with a protective layer to modify the surface of the part, for example.

However, providing the protective layer on the wet area part adds color or a damage or separation of the protective layer impairs the appearance of the part, which is a problem. On the other hand, it is difficult to prevent the stains from adhering to the surface of the wet area part; therefore, the stains are usually removed by cleaning. To remove the tough stains such as scales, for example, polishing is performed using a special detergent. This method is a big burden in everyday life. In view of this, it has been desired to remove the stains by simple cleaning.

In a known antifouling technique, a monolayer that is directly chemically bonded to a base material is used as the protective layer. For example, JP 2004-217950 A (PTL 1) discloses that covering a surface of a faucet fitting with fluorine alkylphosphonic acid can obtain scale removability. The monolayer is a thin layer that is not visually recognizable. By providing the monolayer, the function of the monolayer can be imparted to the part with less probability of impairing the appearance of the part. Furthermore, by bonding the monolayer with phosphoric acid, the monolayer can be formed densely. Accordingly, most part of hydroxy groups on the surface of the base material can be shielded, so that the adhesion of stains on the surface of the base material can be prevented and the stains can be removed easily. JP 2000-265526 A (PTL 2) discloses that the adhesion of silicic acid scale stains is suppressed by providing an antifouling layer that shields hydroxy groups on the surface of pottery. It also discloses that this antifouling layer is an antifouling layer coated with and dried a mixture of the hydroxy groups on the surface of pottery, an organic silicon compound containing an alkyl fluoride group, a methylpolysiloxane compound containing a hydrolyzable group, and an organopolysiloxane compound.

On the other hand, a certain type of wet area part is coated with metal in order to have good appearance, corrosion resistance, and abrasion resistance, and the color tone of the part is adjusted by the metal species (chromium, zirconium, or titanium). For example, JP 2003-247085 A (PTL 3) discloses that coating a thin transition layer on a colored layer of a PVD color faucet containing one or a plurality of elements selected from Zr, Ti, Hf, C, and N can achieve not only the resistance against abrasion and against corrosion by chemical substances but also the color tone. Furthermore, http://tanury.com/services/pvd/ (Non-PTL 1) discloses that a colored layer formed by PVD is composed of TiN, TiCN, ZrCN, or the like. Moreover, JP 2009-233920 A (PTL 4) discloses that hydrophilic and hydrophobic patterns of an original plate of printing are formed using decomposition of a self-assembled monolayer (SAM) by a zirconia photocatalyst.

CITATION LIST

Patent Literatures

[PTL 1] JP 2004-217950 A
[PTL 2] JP 2000-265526 A
[PTL 3] JP 2003-247085 A
[PTL 4] JP 2009-233920 A

Non Patent Literature

[NPL 1] http://tanury.com/services/pvd/

SUMMARY OF INVENTION

Technical Problem

The present inventors have experimentally found that the function of removing scales exhibited by a water-repellent surface layer deteriorates largely over time depending on the kind of a lower layer, specifically, due to a colored layer containing Ti or Zr. Moreover, the present inventors have considered that this phenomenon results from the decomposition of the surface layer mainly containing organic components by the photocatalytic action of an oxide film (passivation film) formed by said metal element, and have identified the optimum element composition of the colored layer to maintain and exhibit the water repelling function of the surface layer as well as a surface treatment method to achieve said element composition.

Furthermore, in the part including the surface layer on the colored layer, it is necessary to make the surface layer a thin film in nanometers order for adjusting the surface layer not to change the color tone of the colored layer; however, since such a thin film is transparent to not just a visible light but also a UV light inducing a photocatalytic action, forming the colored layer with a component having a low photocatalytic action can prevent deterioration of the weather resistance of the part.

The present invention is based on these findings.

An object of the present invention is to provide a sanitary equipment part that has higher weather resistance while suppressing the photocatalytic activity of a colored layer and that has a water repelling function of a surface layer.

Solution to Problem

A part according to the present invention is a part comprising a base material, a colored layer on the base material, and a surface layer on the colored layer, wherein the colored layer contains Zr, and optionally, C and/or N, a ratio ($H_{Zr\ oxide}/H_{Zr}$) of a peak height derived from Zr oxide ($H_{Zr\ oxide}$) to a peak height of Zr ($H_{Zr}$) at an interface of the colored layer on the side of the surface layer is more than 0 and less than 4.5, the interface being identified as a point where Zr is detected by sputtering the part from the side of the surface layer with an XPS depth direction analysis, and the ratio ($H_{Zr\ oxide}/H_{Zr}$) at a point where Ar sputtering is performed for 5 minutes from the interface of the colored layer on the side of the surface layer with the XPS depth direction analysis is between 0 or more and less than 3; and the surface layer is water-repellent, and includes a hydrophobic group, and exhibits a sputtering time of 5 minutes or less, the sputtering time being a time taken from the start of the sputtering to an end point of the surface layer, and the end point being defined, in a profile obtained by an XPS depth direction analysis of the surface layer, as a point where a difference of an absolute value between a carbon atom concentration at a certain measurement point and a carbon atom concentration at a measurement point just prior to the certain measurement point is 1.0 at % or less.

BRIEF DESCRIPTION OF DRAWINGS

The FIGURE is a schematic diagram illustrating one example of a part according to the present invention.

DESCRIPTION OF INVENTION

1. Structure of Part

A part 1 according to the present invention includes a base material 10, and a colored layer 20 and a surface layer 40 on the base material 10 as illustrated in the FIGURE. The part 1 may include an intermediate layer 30 between the colored layer 20 and the surface layer 40.

1-1 Surface Layer

The surface layer 40 in the present invention is a water-repellent layer containing organic molecules, and is transparent and thin enough not to damage the color of the colored layer 20 or the base material 10 below the surface layer 40. Since the surface layer 40 is the water-repellent layer, the adhesion of scales can be suppressed and the scales once adhered can be easily removed in a sanitary equipment part contacting with tap water including silicon and calcium (that causes the formation of scales).

Material or Characteristic of Surface Layer

In the present invention, the surface layer 40 may be a high molecular layer, a low molecular layer, or a mono (molecular) layer.

In the present invention, the high molecular layer is a layer containing a high molecule compound. Furthermore, the low molecular layer is a layer containing a low molecule compound. The high molecule compound and the low molecule compound include a hydrophobic group R. Having the hydrophobic group R confers water-repellency on the surface layer 40.

Examples of Hydrophobic Group R

In the present invention, the hydrophobic group R includes an alkyl chain. The hydrophobic group R may include an alkyl chain in which a part of hydrogen atom(s) is substituted with fluorine atom, or an alkyl chain in which a part of carbon atom(s) is substituted with another atom. For example, the hydrophobic group R may include one or more selected from the group consisting of a hydrocarbon group, a fluoroalkyl group, a fluoro(poly)ether group, a fluoroalkoxy group, a fluoroacyl group, an alkoxy group, an acyl group, an alkylthio group, and an alkylamino group.

The hydrophobic group R is preferably a hydrocarbon group consisting of C and H. The hydrocarbon group may be either a saturated hydrocarbon group or an unsaturated hydrocarbon group. The hydrocarbon group may be an open chain hydrocarbon group or a cyclic hydrocarbon group such as an aromatic ring. The hydrophobic group R is preferably an open chain saturated hydrocarbon group, more preferably a straight-chain saturated hydrocarbon group. Since the open chain saturated hydrocarbon group is a flexible molecular chain, it is possible to cover the foundation without gaps and to improve water resistance. When the hydrocarbon group is an open chain hydrocarbon group, the number of carbons is preferably 6 or more to 25 or less, more preferably 10 or more to 18 or less. When the number of carbon atoms is large, the interaction among the molecules is large, so that it is possible to shorten the distance between the molecules in a self-assembled monolayer (SAM) described below, thereby resulting in making it possible to further improve the water resistance.

When the hydrophobic group R is a saturated hydrocarbon group (namely, an alkyl group), a part(s) of hydrogen atoms of the alkyl group may be substituted with another atom. The other atom is, for example, a halogen atom. The halogen atom is, for example, a fluorine atom. The alkyl group in which a part(s) of hydrogen atoms is(are) substituted with a fluorine atom(s) is, for example, a fluoroalkyl group. When the hydrophobic group R includes a fluoroalkyl group, the surface with high water-repellency can be obtained. As a side note, in order to obtain the high scale removability, it is preferable that the surface layer be free of a halogen atom. Furthermore, a part(s) of carbon atom(s) of the alkyl group may be substituted with another atom.

It is preferable that the high molecule compound and the low molecule compound include a functional group capable of bonding to a metal element. The functional group preferably includes one or more selected from the group consisting of a phosphonic acid group, a phosphoric acid group, a phosphinic acid group, a carboxy group, a silanol group (or a precursor of silanol such as an alkoxysilyl group), a β-diol group, an amino group, a hydroxy group, a hydroxyamide group, and an α- or a β-hydroxycarboxylic acid group. More preferably, a phosphonic acid group or a silanol group (or a precursor of silanol such as alkoxysilyl group) is included as the functional group. These functional groups are preferably bonded to a metal element contained in the colored layer 20 or the intermediate layer 30. In other words, it is preferable that the surface layer 40 be bonded to the colored layer 20 or the intermediate layer 30 through these functional groups.

Preferable Structure of Surface Layer

In the present invention, the surface layer 40 is a layer containing the hydrophobic group R and a functional group X with coordination to the metal element. The surface layer 40 is preferably a monolayer formed of a single layer, and is more preferably a self-assembled monolayer (SAM) formed of a non-polymeric organic ligand R-X described below. The self-assembled monolayer is a layer in which molecules are assembled densely, and is thus excellent in water-repellency.

The thickness of the SAM is about the same as the length of one constituent molecule. Here, the "thickness" refers to the length of the SAM in a Z direction. Here, in the FIGURE, the Z direction is a direction from the base material 10 to the surface layer 40. The thickness of the SAM is 10 nm or less, preferably 5 nm or less, and more preferably 3 nm or less. In addition, the thickness of the SAM is 0.5 nm or more, and preferably 1 nm or more. In the case of using constituent molecules such that the thickness of SAM falls within such a range, it is possible to efficiently coat the base material 10, and to obtain a sanitary equipment part having excellent removability on pollutants including the scales.

Structure of SAM

In the present invention, the SAM is an aggregate of molecules formed on a surface of the colored layer 20 or the intermediate layer 30 in the process of organic molecules adsorbing onto a surface of a solid, and the interaction between the molecules causes the molecules constituting the aggregate to densely aggregate. In the present invention, the SAM preferably contains an alkyl group. As a result, hydrophobic interaction acts between the molecules and allows the molecules to densely assemble, so that it is possible to obtain a sanitary equipment part having excellent stain removability.

Definition of Molecules Forming SAM

In a preferred embodiment of the present invention, the non-polymeric organic ligand R-X includes the hydrophobic group R and the functional group X with coordination to the metal element contained in the colored layer 20 or the intermediate layer 30. The non-polymeric organic ligand R-X is bonded to the colored layer 20 or the intermediate layer 30 through the functional group X. Here, the term "non-polymeric" refers to a compound that does not correspond to the definition 1.1 in the glossary (in Japanese translation) of basic terms in Polymer Science published by the International Union of Pure and Applied Chemistry (IUPAC) Commission on Polymer Nomenclature (that is, a molecule which has a large relative molecular mass and has a structure constituting of a large number of repetitions of units obtained substantially or conceptually from molecules having a small relative molecular mass, see http://main-.spsj.or.jp/c19/iupac/Recommendations/glossary36.html). The SAM is a layer formed of such a non-polymeric organic ligand R-X.

Non-Polymeric Organic Ligand R-X

In a preferred embodiment of the present invention, the surface layer 40 is a layer formed using the non-polymeric organic ligand R-X. The hydrophobic group R may be the aforementioned one. The hydrophobic group R preferably includes a hydrocarbon group consisting of C and H. An atom(s) other than carbon atom may be substituted at one or two positions in the skeleton of the hydrocarbon group included in the hydrophobic group R. The atom(s) to be substituted with the atom(s) other than carbon atom may be oxygen, nitrogen, or sulfur. Preferably, one end of the hydrophobic group R (i.e., an end that is not a bonding end to X) is a methyl group. As a result, the surface of the part 1 becomes water-repellent, thereby making it possible to improve the stain removability.

Examples of X

In the present invention, the functional group X is preferably at least one selected from a phosphonic acid group, a phosphoric acid group, a phosphinic acid group, a carboxy group, a silanol group (or a precursor of silanol such as an alkoxysilyl group), a β-diol group, an amino group, a hydroxy group, a hydroxyamide group, and an α- or a β-hydroxycarboxylic acid group.

The carboxy group, the β-diol group, the amino group, the hydroxy group, the hydroxyamide group, and the α- or the β-hydroxycarboxylic acid group do not polymerize with one another, and are coordinated to (adsorbing to) the metal element contained in the colored layer 20 or the intermediate layer 30; therefore, a dense surface layer is formed.

According to a preferred embodiment of the present invention, X is at least one kind selected from a phosphonic acid group, a phosphoric acid group, and a phosphinic acid group among the functional groups containing a phosphorus atom, and X is more preferably a phosphonic acid group. According to another preferred embodiment, X is a silanol group. Thus, a part with high water resistance and excellent removability on pollutants can be effectively obtained.

Structure of R-X

In the present invention, the surface layer 40 may be formed of two or more types of R-X. The surface layer formed of two or more types of R-X means a surface layer formed of multiple types of the above-mentioned compounds mixed therein. In addition, in the present invention, the surface layer 40 may contain a trace amount of organic molecules other than R-X as long as the scale removability is not impaired.

Examples of R-X

The organic phosphonic acid compound represented by the general formula R-X is preferably octadecylphosphonic acid, hexadecylphosphonic acid, dodecylphosphonic acid, decylphosphonic acid, octylphosphonic acid, hexylphosphonic acid, perfluorodecylphosphonic acid, perfluorohexylphosphonic acid, or perfluorooctylphosphonic acid, and more preferably octadecylphosphonic acid, hexadecylphosphonic acid, dodecylphosphonic acid, or decylphosphonic acid. Furthermore, octadecylphosphonic acid is much more preferable.

In R-X, phosphonic acid may be used as a molecule with a phosphonic acid group, (organic) phosphoric acid may be used as a molecule with a phosphoric acid group, phosphinic acid may be used as a molecule with a phosphinic acid group, carboxylic acid may be used as a molecule with a carboxy group, protocatechuic acid, gallic acid, dopa, or a catechol(orthohydroxyphenyl) group may be used as a molecule with a β-diol group, amino acid may be used as a molecule with an amino group, alcohol may be used as a molecule with a hydroxy group, hydroxamic acid may be used as a molecule with a hydroxyamide group, and salicylic acid or quinic acid may be used as a molecule with an α- or a β-hydroxycarboxylic acid group.

1-2 Intermediate Layer

In a preferred embodiment of the present invention, the intermediate layer 30 may be provided between the colored layer 20 and the surface layer 40. The intermediate layer 30 can have good adhesion to the surface layer 40 and to the base material 10. One preferable example of the intermediate layer 30 is a layer containing a metal atom and an oxygen atom. In the intermediate layer 30, the metal atom is bonded to the oxygen atom. In other words, the intermediate layer 30 contains a metal element in an oxidized state. In the present invention, the metal element is preferably at least one selected from Cr and Si. In addition, it is preferable that the intermediate layer 30 be as thick as or thinner than the surface layer 40 in order not to impair the color tone of the foundation,

1-3 Colored Layer

In the present invention, the colored layer 20 is an inorganic layer containing Zr, and optionally, C and/or N. By having such a composition, the colored layer 20 can adhere onto the surface layer 40 described below; and also can exhibit such a color that at least one absolute value of $\Delta L^*$, $\Delta a^*$, and $\Delta b^*$ of the surface of the part including the colored layer 20 is greater than zero compared to the surface of the part without the colored layer 20.

Preferable Structure of Colored Layer

In the present invention, it is preferable that the colored layer 20 contains
- 15 at % or more to 65 at % or less of Zr,
- 10 at % or more to 40 at % or less of O,
- 25 at % or more to 45 at % or less of C and N, and
- 0 at % or more to 20 at % or less of a metal element (excluding Ti) other than Zr, on the proviso that
- the total of a combination of the Zr, O, C and N, and the metal element (excluding Ti) other than Zr is 100 at %, and that the colored layer optionally contains 1.0 at % or less of an element other than the combination. As the metal element other than Zr, for example, Cr may be contained.

In the present invention, it is more preferable that the colored layer 20 contains
- 25 at % to more and 55 at % or less of Zr,
- 10 at % or more to 40 at % or less of O,
- 25 at % or more to 45 at % or less of C and N, and
- 0 at % or more to 10 at % or less of a metal element (excluding Ti) other than Zr, on the proviso that
- the total of a combination of the Zr, O, C, and N, and the metal element (excluding Ti) other than Zr is 100 at %, and that the colored layer optionally contains 1.0 at % or less of an element other than the combination.

In the present invention, the colored layer 20 preferably includes an oxide film on the surface on the side of the surface layer 40. The oxide film preferably has a thickness of smaller than 30 nm. The oxide film is capable of chemically bonding to the aforementioned functional group X included in the surface layer, and thus, the surface layer 40 can have high durability. Here, the oxide film means a film formed of the oxide of the metal element contained in the colored layer 20. Specifically, the oxide film means a film formed of the oxide of Zr or a metal element excluding Ti contained in the colored layer 20. The upper limit of the thickness of the oxide film is preferably less than 30 nm, more preferably less than 10 nm, and much more preferably less than 1 nm. The lower limit of the thickness of the oxide film is preferably larger than 0 nm.

1-4 Base Material

In the present invention, the material of the base material 10 is not particularly limited, and, for example, materials generally used as base materials of the sanitary equipment part can be used.

Support Member 10a of Base Material 10

The base material 10 includes a support member 10a. That is to say, the base material 10 consists of the support member 10a, includes the support member 10a and another element, or includes a region 10b, which is described below, on a surface of the support member 10a, the surface being present on the side of the surface layer 40. The material of the support member 10a may be a metal, resin, ceramic, pottery, or glass.

Region 10b of Base Material 10

The base material 10 may include the region 10b. The region 10b is formed on a surface of the support member 10a, the surface being present on the side of the surface layer. The region 10b is preferably a layer containing a metal, or a layer consisting of an inorganic compound mainly containing carbon. The region 10b can be formed by metal plating or physical vapor deposition (PVD), for example. The region 10b may consist of only metal elements, or may include metal nitrides (such as TiN and TiAlN), metal carbides (such as CrC), metal carbonitrides (such as TiCN, CrCN, ZrCN, and ZrGaCN), or the like. The region 10b may be formed directly on the support member 10a, or may include a different layer between the region 10b and the support member 10a. For example, the base material 10 provided therein the region 10b includes a metal-plated product in which the region 10b is provided by a metal plating treatment on the support member 10a formed of brass or a resin. On the other hand, for example, the base material 10 not provided therein the region 10b includes a metal molded product such as stainless steel (SUS). The shape of the base material 10 is not particularly limited, and may be a simple flat plate shape or a three-dimensional shape, and is preferably the three-dimensional shape.

2. Identification of Part

In the present invention, the part 1 can be identified by the following method. First, it is confirmed that the surface of the part 1 is water-repellent and that the part 1 has the surface layer 40. Next, the elements constituting the surface layer 40 are identified by XPS measurement. In addition, the thickness of the surface layer 40 and the intermediate layer 30 is obtained by sputtering the respective layers, while measuring the ratio of the elements present therein with the XPS measurement. Next, regarding the identification of the colored layer 20 and the base material 10, the border between the colored layer 20 and the base material 10 is identified by observing the cross section of the layers with SEM. The elements contained in the colored layer 20 are identified by the depth direction analysis with the XPS measurement. Before the above measurement, pre-treatment is performed in order to remove the stain adhered onto the surface. The details are described below.

Pre-Treatment

In the present invention, the surface of the part 1 is washed before the measurement to sufficiently remove the stains adhered onto the surface. For example, before the measurement, the surface of the part 1 is subjected to wipe washing with ethanol and sponge slide washing with a neutral detergent, and then thorough rinse washing with ultrapure water. In case the part 1 is a rough-surfaced part whose surface has been subjected to hairline processing, shot blasting, or the like, a portion with as high surface smoothness as possible is selected and measured. The portion with high smoothness, which diffuses light more than the rough portion, corresponds to the portion where L* obtained by the SCE method excluding a regular reflection light in the case of measuring the color difference using a spectrometer or the like is less than 5.

In the present invention, when the surface of the part 1 is analyzed, a portion having a relatively large radius of curvature is preferably selected from the surface of the part 1. It is preferable to use the part 1 that is cut into an analyzable size as a measurement sample. At the time of cutting, the portion to be analyzed or evaluated is preferably covered with a film or the like to prevent surface damage.

2-1. Surface Layer

Identification of Hydrophobic Group of Surface Layer

In the present invention, it can be confirmed in detail that the surface layer 40 is a layer containing an alkyl group through the following procedure. First, the water-repellency of the surface layer 40 is evaluated and the formation of the water-repellent surface layer 40 is confirmed. As a method for evaluating the water-repellency, evaluation of a water droplet contact angle described below can be used, for example. The water-repellent surface layer 40 is subjected to surface elemental analysis by XPS analysis, and thus the elements contained in the surface layer 40 are confirmed.

In the present invention, the fact that the surface layer 40 is a layer containing the hydrophobic group can be confirmed by checking the presence of the alkyl chain contained in the hydrophobic group in accordance with the following procedure.

First, the surface elemental analysis is performed by the XPS analysis, and it is confirmed that the peak at 284 to 285 eV derived from the C—C bond of the alkyl chain contained in the hydrophobic group is detected.

Next, the peak shift ($cm^{-1}$) derived from the hydrophobic group is confirmed using infrared spectroscopy or Surface Enhanced Raman Spectroscopy (SERS).

In the case of using the infrared spectroscopy, reflection absorption spectroscopy can be used. As a measurement device for the reflection absorption spectroscopy, a Fourier transformation infrared spectroscopy (FT-IR) device including an attachment (for example, Seagull manufactured by Barrick Scientific Products Inc.) capable of highly reflective measurement with the infrared ray incidence angle variable to 80° or more can be used. Examples of the infrared spectroscopy device include Cary 630IR (Agilent Technologies Japan, Ltd.) and Nicolet iS50 (Thermo Fisher Scientific K. K.).

The measurement using FT-IR in line with reflection absorption spectroscopy is conducted under the following conditions. Infrared ray incidence angle: 85°, detector: MCT detector, wavenumber resolution: 2 $cm^{-1}$, and cumulative number: 256.

First, only the base material (on which no layer such as the surface layer is formed) that is used in the sanitary equipment part to be measured is measured as a reference. Here, a plate material or the like formed of the same material as the base material to be measured may be used, as an alternative to the base material used in the sanitary equipment part. Then, by measuring the cutout sanitary equipment part 1, the IR spectrum is obtained. In the IR spectrum thus obtained, the horizontal axis represents wavenumber ($cm^{-1}$), and the vertical axis represents transmissivity or absorbance.

In the obtained IR spectrum, it can be confirmed that the surface layer 40 includes the hydrophobic group. The existence of the alkyl chain can be confirmed by detecting the wavenumbers derived from the methyl group of around 2960 $cm^{-1}$ and around 2930 $cm^{-1}$; and the wavenumbers derived from the alkyl chain ($—(CH_2)_n—$) of around 2850 $cm^{-1}$ and around 2920 $cm^{-1}$. In case the hydrophobic group includes the alkyl chain in which a part(s) of hydrogen atom(s) is(are) substituted with fluorine, the existence of the alkyl chain in which the part(s) of hydrogen atom(s) is(are) substituted with fluorine can be confirmed by detecting the wavenumbers of around 1295 $cm^{-1}$, around 1200 $cm^{-1}$, and around 1150 $cm^{-1}$. In case of other hydrophobic groups, the wavenumbers corresponding thereto are checked. When an absorbance value is three times or more of the average of the absorbance values at 100 $cm^{-1}$ which is the minimum value in the measurement range, it is regarded that the corresponding wavenumber is detected and the existence of the corresponding hydrophobic groups is confirmed.

In the case of using surface enhanced Raman spectroscopy, a surface enhanced Raman spectroscopy analyzer including a transmission-type surface enhanced sensor (transmission type SERS sensor) and a confocal microscope Raman spectrometer is used. The transmission-type surface enhanced sensor may be, for example, the one described in Example 1 of JP 6179905 B. The confocal microscope Raman spectrometer may be, for example, NanoFinder30 (Tokyo Instruments Inc.).

The measurement method using the surface enhanced Raman spectroscopy is described below. The measurement is performed with a transmission-type surface enhanced sensor placed on the surface of the cutout sanitary equipment part 1. The measurement conditions are such that Nd: YAG laser (532 nm, 1.2 mW), scan time (10 seconds), grating (800 Grooves/mm), and pinhole size (100 μm). A Raman spectrum is obtained as a measurement result. In the Raman spectrum, the horizontal axis represents Raman shift ($cm^{-1}$) and the vertical axis represents signal intensity.

In the Raman spectrum thus obtained, the existence of the hydrophobic group can be confirmed by detecting the Raman shift derived from the methyl group of around 2930 $cm^{-1}$ and the Raman shift derived from the alkyl chain ($—(CH_2)_n—$) of around 2850 $cm^{-1}$ and around 2920 $cm^{-1}$. In case the hydrophobic group includes the alkyl chain in which a part(s) of hydrogen atom(s) is(are) substituted with fluorine, the existence of the alkyl chain in which the part(s) of hydrogen atom(s) is(are) substituted with fluorine can be confirmed by detecting the Raman shifts derived from ($—(CF_2)_n—$) of around 735 $cm^{-1}$ and around 1295 $cm^{-1}$. In case of other alkyl groups, the Raman shifts corresponding thereto are checked. It is regarded that the signal of the Raman shift is detected and the existence of the corresponding hydrophobic groups is confirmed when the signal has three times or more signal intensity than the average value of the signal intensities at 100 $cm^{-1}$ which is the minimum signal intensity in the measurement range.

Identification of Hydrophobic Group (R) and X when the Surface Layer is a Monolayer In the present invention, when the surface layer 40 is a layer containing the hydrophobic group R and the functional group X that can be bonded to the metal element, in particular, is a monolayer formed of a single layer, it is possible to identify that the surface layer 40 is the layer containing R and X by the following method.

First, the surface elemental analysis is conducted by XPS analysis and the elements contained in the surface layer 40 are confirmed.

Next, the molecular structure is identified by mass spectrometry from the mass-to-charge ratio (m/z) derived from the molecules of the components existing on the surface. For mass spectrometry, time-of-flight secondary ion mass spectrometry (TOF-SIMS) or high resolution mass spectrometry (HR-MS) can be used. Here, the high resolution mass spectrometry refers to a method capable of measurement with an accuracy of the mass resolution that is less than 0.0001 u (u: unified atomic mass units) or 0.0001 Da, and the elemental composition can be estimated from the precise mass. The HR-MS includes double-focusing mass spectrometry, time-of-flight tandem mass spectrometry (Q-TOF-MS), Fourier transform ion cyclotron resonance mass spectrometry (FT-ICR-MS), Orbitrap mass spectrometry, and the like, and time-of-flight tandem mass spectrometry (Q-TOF-MS) is employed in the present invention. For mass spectrometry, it is desirable to use HR-MS when sampling of R and X in a sufficient amount from the part 1 is possible. On the other hand, when sampling of R and X in a sufficient amount from the part is impossible due to the small size of the part 1 or the like, it is desirable to use TOF-SIMS. When mass spectrometry is used, the presence of R and X can be confirmed by detecting the ionic intensity of m/z corresponding to the ionized R and X. Here, it is regarded that an ionic intensity is detected when the ion intensity is three times or more than that of the average value of 50 Da before and after, centering on m/z, which is the lowest value in the range in which the ionic intensity is calculated in the measurement range.

TOF-SIMS Measurement Conditions when R and X in the Surface Layer are Recognized As the time-of-flight secondary ion mass spectrometry (TOF-SIMS) device, for example, TOF-SIMS 5 (manufactured by ION-TOF) is used. The measurement conditions are such that primary ions to be emitted: 209Bi3++, primary ion acceleration voltage 25 kV, pulse width 10.5 or 7.8 ns, bunching: on, electrification neutralization: off, post acceleration: 9.5 kV, measurement range (area): about 500*500 $\mu m^2$, secondary ions to be detected: Positive, Negative, Cycle Time: 110 µs, scan count 16. As a measurement result, a secondary ion mass spectrum (m/z) derived from R and X is obtained. In the secondary ion mass spectrum, the horizontal axis represents the mass-to-charge ratio (m/z), and the vertical axis represents the intensity of the detected ions (count).

HR/MS Measurement Conditions when R and X in the Surface Layer are Recognized

As the high resolution mass spectrometer, a time-of-flight tandem mass spectrometer (Q-TOF-MS), for example, Triple TOF 4600 (manufactured by SCIEX) is used. In the measurement, for example, the cutout base material is immersed in ethanol, and the component (R and X) used for forming the surface layer 40 is extracted with unnecessary components filtered, transferred to a vial (about 1 mL), and then measured. MS/MS measurement is performed under the measurement conditions, ion source: ESI/Duo Spray Ion Source, ion mode (Positive/Negative), IS voltage (−4500 V), source temperature (600° C.), DP (100 V), and CE (40 V), for example. As a measurement result, an MS/MS spectrum is obtained. In the MS/MS spectrum, the horizontal axis represents the mass-to-charge ratio (m/z), and the vertical axis represents the intensity of the detected ions (count).

Measurement of Atom Concentration of Each Layer

The composition of the surface layer 40, the intermediate layer 30, and the colored layer 20 is obtained by X-ray photoelectron spectroscopy (XPS). It is preferable that, before the measurement, the part 1 be subjected to sponge sliding with a neutral detergent and then to sufficient rinse-washing with ultrapure water. As the XPS device, PHI Quantera II (manufactured by ULVAC-PHI, Inc.) is preferably used. The respective elements contained in the surface layer 40, the intermediate layer 30, and the colored layer 20 are subjected to the XPS depth direction analysis using "XPS measurement conditions" and "sputtering conditions 1" each described below, thereby obtaining the spectrum.

The concentration of the detected atoms can be calculated from the obtained spectrum by using data analysis software PHI MultiPak (manufactured by ULVAC-PHI, Inc.). For the obtained spectrum, the Shirley method is carried out on the measured peaks based on the electron orbits of the atoms to remove the background, and thereafter the peak area intensity is calculated. Correction processing is performed by dividing the peak area intensity by the sensitive factors which is unique to the device and is pre-set in the data analysis software. The ratio of the peak area of a certain element after the correction to the total peak area intensity of all the measured elements after the correction is defined as the atom concentration of the object and calculated in terms of at. %.

It is noted that XPS is a method of performing energy analysis by irradiating a sample surface with soft X-ray and capturing photoelectrons emitted as the sample surface is ionized, and the obtained spectrum exhibits the photoelectron peak emitted from each electron orbit, so that an element is expressed as the symbol for the element+the electron orbit thereof (for example, the photoelectron peak obtained from the 1s orbit of carbon is expressed as C1s).

XPS Measurement Conditions

In all the XPS measurements described herein, the following "XPS measurement conditions" are used.

XPS Measurement Conditions

X-ray condition: monochromatic AlKα ray (output 25 W)

Photoelectron take-off angle: 45°

Analysis area: 100 µmφ

Charge neutralizer setting: 1.0 V, 10 µA

Time per step: 50 ms

Sweep: five times

Pass energy: 112 eV

Element to be analyzed (energy range): Zr3d (177-187 eV), C1s (281-296 eV), N1s (394-406 eV), O1s (524-540 eV), Cr2p3 (572-582 eV), Ti2p (452-463 eV), Si2p (98-108 eV)

In the present invention, the element composition in the depth direction of each layer and the like are identified by performing the depth direction analysis with a combination of the XPS measurement and the sputtering using Ar ions. In the present invention, the depth direction analysis with a combination of the XPS measurement and the sputtering using Ar ions is referred to as "XPS depth direction analysis". In the XPS depth direction analysis, the sputtering using Ar ions and the XPS measurement are alternately repeated. As the conditions in the XPS measurement, "XPS measurement conditions" described above can be used. As the conditions at the sputtering (hereinafter also referred to as "sputtering conditions"), the following conditions can be used. The XPS measurement is performed for the respective "sputtering cycle"s in the respective sputtering conditions. By the XPS depth direction analysis, the spectrum information is obtained. From this spectrum information, the depth profile (profile) of the element composition is acquired. From this profile, the element composition in the depth direction can be identified.

Sputtering Conditions 1

(Sputtering conditions 1 at the XPS depth direction analysis, hereinafter referred to as "sputtering conditions 1")
Inert gas species: Ar
Sputtering voltage: 500 V
Sputtering range: 2 mm*2 mm
Sputtering cycle: 10 seconds It is noted that the sputtering voltage is the voltage that is applied to an Ar ion gun and the sputtering range is the range on the surface that is cut by sputtering. The sputtering cycle is the time for which Ar gas is emitted continuously for each measurement in the depth direction, and the total of the sputtering cycles is a sputtering time.

Sputtering Conditions 2

(Sputtering conditions 2 at the XPS depth direction analysis, hereinafter referred to as "sputtering conditions 2")
Inert gas species: Ar
Sputtering voltage: 500 V
Sputtering range: 2 mm*2 mm
Sputtering cycle: 1 minute Thickness of Surface Layer In the present invention, the surface layer 40 has a sputtering time of 5 minutes or less, preferably 3 minutes or less, the sputtering time being a time taken from the start of the sputtering to an end point of the surface layer, and the end point being defined, in a profile obtained by the XPS depth direction analysis, as a point where a difference of an absolute value between a carbon atom concentration at a certain measurement point and a carbon atom concentration at a measurement point just prior to the certain measurement point is 1.0 at % or less. Here, the "profile obtained by the XPS depth direction analysis" refers to the profile obtained by performing the XPS depth direction analysis using the "XPS measurement conditions" and "sputtering conditions 1" described above. In addition, the lower limit value of the sputtering time is preferably 0.5 minute or more. The preferable range of the sputtering time may be determined by the combination of these upper limit value and lower limit value. Before the XPS depth direction analysis, first, the water-repellency of the surface layer is evaluated and the formation of the water-repellent surface layer is confirmed. It is preferable that three points be selected at random from the water-repellent surface layer and be measured, and the average of these three points is determined to be the thickness of the surface layer.

Preferable Carbon Atom Concentration in Surface Layer

In the present invention, in case the surface layer 40 contains the hydrocarbon group, the carbon atom concentration of the surface layer 40 is preferably 35 at % or more, more preferably 40 at % or more, much more preferably 43 at % or more, and the most preferably 45 at % or more. In addition, the carbon atom concentration is preferably less than 70 at %, more preferably 65 at % or less, and much more preferably 60 at % or less. The preferable range of the carbon atom concentration may be determined by the appropriate combination of these upper limit value and lower limit value. Adjusting the carbon atom concentration within this range can enhance the scale removability.

Preferable Metal Atom Concentration of Surface Layer

In the present invention, the metal atom concentration of the surface layer 40 is preferably 1.0 at % or more to less than 10 at %. Adjusting the metal atom concentration within this range allows the surface layer 40 to be dense. Thus, the sanitary equipment part with sufficient water resistance and excellent scale removability can be obtained. More preferably, the metal atom concentration is 1.5 at % or more to less than 10 at %. Accordingly, the water resistance and the scale removability can be further enhanced.

Preferable Water-Repellency of Surface Layer

The water droplet contact angle on the sanitary equipment part 1 according to the present invention, that is, the surface layer 40 is preferably 90° or more, more preferably 100° or more. The water droplet contact angle means a static contact angle, and is obtained by dropping 2 µl of water droplet on the surface layer 40 and photographing the water droplet after one second from the side surface of the base material. As the measurement device, for example, a contact angle meter (model number: SDMs-401 manufactured by Kyowa Interface Science Co., Ltd.) can be used.

2-2. Intermediate Layer

In the present invention, the intermediate layer 30 can be identified by the XPS depth direction analysis. First, the XPS depth direction analysis is performed for 10 minutes using the "XPS measurement conditions" and the "sputtering conditions 1" described above. Thus, the depth direction profile is obtained. In this profile, confirmed is the metal element detected by 10 at % or more at the point where the difference in carbon atoms detected between a certain measurement point and a measurement point just prior to the certain measurement point becomes 1.0 at % or less. In case the concentration of the metal element becomes 3.0 at % or less after ten-minute sputtering, the range where the element exists can be determined to be the intermediate layer. In case the concentration of the metal element does not decrease to 3.0 at % or less after ten-minute sputtering, it is determined that the part does not include the intermediate layer.

2-3. Colored Layer

The colored layer 20 can be identified by the following method. First, the part including the colored layer 20 is cut in a direction perpendicular to the colored layer 20 (in the Z direction shown in the FIGURE), and the resulting surface is milled using an ion milling device to obtain a smooth cross section. By observing the cross section with a scanning electron microscope/energy dispersive X-ray spectroscopy (SEM/EDX), the colored layer 20 and the base material 10 can be identified. For the observation region, a SEM image is acquired so that the interface between the colored layer 20 and the base material 10 exists in the SEM image. By performing the mapping analysis with EDX on the SEM image, the element distribution of the colored layer 20 and the base material 10 can be visually confirmed. A boundary surface where different element distributions is confirmed is identified as the boundary surface between the colored layer 20 and the base material 10. Thus, the colored layer 20 can be identified.

Identification of Oxidation Degree of Zr in Colored Layer

In the present invention, the colored layer 20 has a property that the ratio ($H_{Zr\ oxide}/H_{Zr}$) of the peak height derived from Zr oxide ($H_{Zr\ oxide}$) to the peak height of Zr ($H_{Zr}$) at the interface of the colored layer on the side of the surface layer is more than 0 to less than 4.5; and also has a property that the ratio ($H_{Zr\ oxide}/H_{Zr}$) at a point where Ar sputtering is performed for 5 minutes from the interface of the colored layer on the side of the surface layer with the XPS depth direction analysis is 0 or more to less than 3.0. When the oxidation degree of Zr in these regions of the colored layer 20 is within the above range, the photocatalytic activity is suppressed, and as a result, the deterioration in weather resistance of the part is suppressed. Preferably, the ratio ($H_{Zr\ oxide}/H_{Zr}$) of the peak height derived from Zr oxide ($H_{Zr\ oxide}$) to the peak height of Zr ($H_{Zr}$) at the interface of the colored layer 20 on the side of the surface layer is 2 or more to 4 or less. In addition, preferably, the ratio ($H_{Zr\ oxide}/H_{Zr}$) at the point where Ar sputtering is performed for 5 minutes from the interface of the colored layer on the side of the surface layer with the XPS depth direction analysis is 0.5 or more to less than 1.5. Here, the "interface of the colored layer on the side of the surface layer" means the interface between the surface layer 10 and the colored layer 20 that is specified by the point where Zr is detected by the sputtering the part from the surface layer with the XPS depth direction analysis.

In the present invention, the oxidation degree of zirconium (Zr) in the colored layer 20 can be calculated by using the ratio ($H_{Zr\ oxide}/H_{Zr}$) of the peak height of Zr in the oxidized state to the peak height of Zr obtained by the XPS measurement. A specific calculation method is described below. First, the Zr spectra at the respective positions described in the following paragraphs are obtained. Next, the Zr spectra thus obtained are analyzed using MultiPak (manufactured by ULVAC-PHI, Inc.) as the data analysis software. In this analysis, both ends of the base line are set to 176 eV and 189 eV. The peak height around 180 eV is regarded as $H_{Zr}$, and the peak height around 182 eV is regarded as $H_{Zr\ oxide}$, and the respective peak heights are calculated. The peak height is obtained by subtracting the base line intensity at the peak position from the maximum intensity of the peak.

Zr Spectrum at Interface of the Colored Layer on the Side of the Surface Layer In the present invention, the oxidation degree of Zr at the interface of the colored layer 20 on the side of the surface layer, that is, the ratio ($H_{Zr\ oxide}/H_{Zr}$) of the peak height derived from Zr oxide ($H_{ZR\ oxide}$) to the peak height of Zr ($H_{Zr}$) at the interface on the side of the surface layer is obtained from the following Zr spectrum. The XPS depth direction analysis using the aforementioned "sputtering conditions 1" and "XPS measurement conditions" is performed. Thereby, obtained is the Zr spectrum at the point closest to the side of the surface layer where the Zr peak is detected by 1.0 at % or more.

Zr Spectrum at Predetermined Depth from Interface of the Colored Layer on the Side of the Surface Layer In the present invention, the oxidation degree of Zr at a predetermined depth from the interface of the colored layer 20 on the side of the surface layer, that is, the ratio ($H_{Zr\ oxide}/H_{Zr}$) of the peak height derived from Zr oxide ($H_{Zr\ oxide}$) to the peak height of Zr ($H_{Zr}$) at the point where Ar sputtering is performed for 5 minutes from the interface on the side of the surface layer with the XPS depth direction analysis is obtained from the following Zr spectrum. First, the XPS depth direction analysis using the aforementioned "sputtering conditions 1" and "XPS measurement conditions" is performed. The point where the Zr peak is detected by 1.0 at % or more in this analysis result is specified as a start point. Thereafter, obtained is the Zr spectrum at the point where the XPS depth direction analysis is performed for 5 minutes from the start point using the aforementioned "sputtering conditions 2" and "XPS measurement conditions."

Composition Analysis of Colored Layer

The composition of the colored layer 20 is obtained by the XPS depth direction analysis. First, the sanitary equipment part 1 is subjected to the XPS depth direction analysis using the aforementioned "sputtering conditions 1" and "XPS measurement conditions". In the profile thus obtained, the point where the Zr peak is detected by 1.0 at % or more is set as a start point. The composition at the point where the XPS depth direction analysis is performed for 5 minutes from the start point using the aforementioned "sputtering conditions 2" and "XPS measurement conditions" is set as the composition of the colored layer 20. From this composition, it can be confirmed that the colored layer 20 contains Zr, O, C, N, and metal elements (excluding Ti) other than Zr, and the atom concentration of each element can be confirmed.

Method for Manufacturing Part

In the present invention, the part 1 is manufactured by the steps of providing the base material 10, forming the colored layer 20 on the base material, optionally forming the intermediate layer 30, and further forming the surface layer 40. The colored layer 20 can be formed by, for example, physical vapor deposition (PVD). Before the surface layer 40 is formed, a surface of the colored layer 20 is preferably subjected to pre-treatment. The pre-treatment for removing stains on the surface may include cleaning with a neutral detergent, UV ozone treatment, alkali treatment, or the like.

Application of Part

In the present invention, the "sanitary equipment" is a water supply and drainage equipment of a building or indoor equipment, and is preferably indoor equipment. Furthermore, it is preferably used in an environment exposed to water such as water for domestic use (or water for industrial use), In the present invention, the environment exposed to water may be any place where water is used, and includes places where water is used, such as houses and public facilities like as parks, commercial facilities, and offices. Such places preferably include bathrooms, toilet spaces, dressing rooms, washrooms, kitchens, and the like.

In the present invention, the indoor equipment is used in houses and public facilities such as commercial facilities and is touched by humans. The indoor equipment is preferably equipment used in bathrooms, toilet spaces, dressing rooms, washrooms, kitchens, and the like. The sanitary equipment part of the present invention used as indoor equipment includes products such as plated or PVD-coated ones. Specific examples include faucets, drain fittings, water blocking fittings, washbasins, doors, shower heads, shower bars, shower hooks, shower hoses, handrails, towel hangers, kitchen counters, kitchen sinks, drainage baskets, kitchen hoods, ventilation fans, drains, toilet bowls, urinals, electronic bidets, lids for electronic bidets, nozzles for electronic bidets, operation panels, operation switches, operation levers, handles, and doorknobs. The sanitary equipment part according to the present invention is preferably a faucet, a faucet fitting, a drain fitting, a water blocking fitting, a washbasin, a shower head, a shower bar, a shower hook, a shower hose, a handrail, a towel hanger, a kitchen counter, a kitchen sink, or a drainage basket. In particular, the sanitary equipment part of the present invention can be suitably used as a faucet, or as a part used in the bathroom or toilet spaces.

EXAMPLES

The present invention is described in more detail with reference to the following examples. The present invention, however, is not limited to these examples.

3. Manufacture of Part

3-1 Base Material and Colored Layer

As a base material, a brass flat plate plated with nickel chromium was manufactured. On this flat plate, a colored layer containing zirconium (Zr) was formed by physical vapor deposition (PVD).

The colored layer was formed by an arc ion plating method. As a target, a zirconium plate and a chromium plate were used. As a pressure applied at the film formation, the pressure was 1 Pa or less. As gases applied at the film formation, argon, acetylene, and nitrogen were used. By changing the gas flow rate at the film formation, the amount of carbon and nitrogen contained in the colored layer was adjusted.

3-2 Pre-Treatment

Examples 1 to 4, 10, 11 and Comparative Example 3

In order to remove stains present on the surface of the base material (provided thereon the colored layer), the base material was ultrasonically washed with an aqueous solution containing a neutral detergent, and then was sufficiently washed with running water. Furthermore, in order to remove the neutral detergent on the base material, the base material was ultrasonically washed with ion-exchanged water, and then, water was removed with an air duster.

Examples 5 and 8

The base material was pre-treated in the same manner as that in Example 1, and then was introduced into a Photo Surface Processor (PL21-200 (S), manufactured by Sen Engineering Co., Ltd.), and then was subject to UV ozone treatment for 5 minutes.

Examples 12, 13

The base material was pre-treated in the same manner as that in Example 1, and then was introduced into a Photo Surface Processor (PL21-200 (S), manufactured by Sen Engineering Co., Ltd.), and then was subject to UV ozone treatment for 10 minutes.

Comparative Examples 1, 2

The base material was pre-treated in the same manner as that in Example 1, and then was introduced into a Photo Surface Processor (PL21-200 (S), manufactured by Sen Engineering Co., Ltd.), and then was subject to UV ozone treatment for 30 minutes.

Examples 6, 7, 9

The base material was pre-treated in the same manner as that in Example 1, and then was immersed in a 5 wt % sodium hydroxide aqueous solution for 5 minutes at 25° C., while irradiated with ultrasonic waves, and then was sufficiently rinse-washed with ion-exchanged water.

3-3 Formation of Surface Layer

Examples 1, 2, 5 to 7, 10, and 11 and Comparative Examples 1 to 3

As a treatment agent for forming a surface layer, a solution in which octadecylphosphonic acid (manufactured by Tokyo Chemical Industry Co., Ltd., product code 00371) was dissolved in ethanol (manufactured by FUJIFILM Wako Pure Chemical Corporation, Wako 1st Grade) was used. The base material (provided thereon the colored layer) was immersed in the treatment agent for 1 minute or more, and was washed with ethanol. Thereafter, the base material was dried in a drier for 10 minutes at 120° C. to form the surface layer on the surface of the base material.

Examples 3, 4, 8, and 9

A nonwoven fabric (product name: BEMCOT M3-II, manufactured by Asahi Kasei Corporation) was impregnated with a solution in which silicone primer (product name: KBM403, manufactured by Shin-Etsu Chemical Co., Ltd.) was dissolved in isopropyl alcohol (manufactured by FUJIFILM Wako Pure Chemical Corporation), and the solution was spread over the entirety of the base material (provided thereon the colored layer), and then, the resulting base material was dried naturally for 10 minutes to form thereon the intermediate layer.

As a treatment agent for forming a surface layer, a coating agent containing an alkyl fluoride group (product name: SURECO2101S, manufactured by AGC Inc.) was used. A nonwoven fabric (product name: BEMCOT M3-II, manufactured by Asahi Kasei Corporation) was impregnated with the treatment agent, and the treatment agent was spread over the entirety of the surface of the intermediate layer. Thereafter, the resulting layers were dried in a drier for 30 minutes at 120° C. to form the surface layer.

Example 12

A nonwoven fabric (product name: BEMCOT M3-II, manufactured by Asahi Kasei Corporation) was impregnated with a solution in which silicone primer (product name: KBM403, manufactured by Shin-Etsu Chemical Co., Ltd.) was dissolved in isopropyl alcohol (manufactured by FUJIFILM Wako Pure Chemical Corporation), and the solution was spread over the entirety of the base material (provided thereon the colored layer), and then, the resulting base material was dried naturally for 10 minutes to form thereon the intermediate layer.

As a treatment agent for forming a surface layer, a coating agent containing a high molecule compound having a silanol group at a terminal end and having perfluoropolyether in a part of a molecular chain (silane compound containing a perfluoropolyether group) was used. A nonwoven fabric (product name: BEMCOT M3-II, manufactured by Asahi Kasei Corporation) was impregnated with the treatment agent, and the treatment agent was spread over the entirety of the surface of the intermediate layer. Thereafter, the resulting layers were dried in a drier for 30 minutes at 120° C. to form the surface layer.

Example 13

As a treatment agent for forming a surface layer, a solution in which (1H, 1H, 2H, 2H-perfluorodecyl) phosphonic acid (Tokyo Chemical Industry Co., Ltd.) was dissolved in ethanol (FUJIFILM Wako Pure Chemical Corporation, Wako 1st Grade) was used. The base material (provided thereon the colored layer) was immersed in the treatment agent for 1 minute or more, and was washed with ethanol. Thereafter, the resulting base material was dried in a drier for 10 minutes at 120° C. to form the surface layer on the surface of the base material.

4. Measurement of Properties

Each of the parts manufactured as described above was subjected to the following analyses and evaluations.

Water Droplet Contact Angle Measurement

Before the measurement, each part was cleaned by rubbing with a urethane sponge using an alkali detergent, and then was sufficiently rinsed with ultrapure water. A contact angle meter (model number: SDMs-401, manufactured by Kyowa Interface Science Co., Ltd.) was used for measuring the water droplet contact angle of each part. Ultrapure water was used as a water for the measurement, and the size of the water droplet to be dropped was 2 µl. The contact angle was a so-called static contact angle, which was set to the value one second after the water was dropped, and the average value of those measured at five different sites was obtained. As a side note, a value that deviates by ±20° or more from an average value of those measured at four sites among the five sites is regarded as an abnormal value, and when a site expressing the abnormal value appeared among the five sites, the average value was calculated by excluding the abnormal value. The results are shown in Table 1.

Scale Removability

On the surface of each part, 20 µl of tap water was dropped, and the part was left for 24 hours to form scales on the part surface thereof. The part having scales formed thereon was evaluated by the following procedure.

A wet cloth was slid back and forth while a light load (80 gf/cm$^2$) was applied to the surface of the part. Counting one back and forth slide as one time, the surface of the part was observed for the following times, and times required to remove the scales completely was recorded.

The surface of the part was observed every five times in the range of 1 to 30 times The surface of the part was observed every ten times in the range of 30 to 100 times The back and forth slide was performed up to 100 times.

It is noted that whether scales were removed was assessed by visually inspecting whether the scales remained on the surface of the part after the surface of the part was washed with running water and the water was removed with an air duster. The results are shown in Table 1.

Weather Resistance Test

The weather resistance test was performed under the following conditions.

Acceleration test device: Super Xenon Weather Meter SX75 (manufactured by Suga Test Instruments Co., Ltd.)

Filter: Sample surface filter #320 (manufactured by Suga Test Instruments Co., Ltd.)

Black panel temperature: 63±3° C.

Water injection: None

Test time: 30 hours

As the other conditions, conditions set forth in JIS D 0205 (enacted in 1970) were used. The scale removability of each part after the test was evaluated in accordance with the aforementioned method.

Measurement of Color Difference of Colored Layer

The surface of each part, and the surface of the part from which the colored layer was removed, that is, the surface plated with nickel chromium were subjected to color measurement under the following conditions. The colored layer was removed with sandpaper. After the colored layer was roughly ground with the sandpaper, the portion to be subjected to color measurement was polished using diamond paste until the portion exhibited metal gloss. The portion to be measured was subjected to XPS measurement and found that the detected metal element was just chromium, the portion was thus determined to be the surface plated with chromium.

Color Measurement Conditions

Device: Spectrometer CM-2600D (manufactured by KONICA MINOLTA, INC.)

Version: 1.42

Measurement parameters: SCI

Color system: L*a*b*

UV setting: UV 0%

Light source: D65

Observation angle of view: 10°

Measurement diameter: φ3 mm

Measurement wavelength intervals: 10 nm

Number of times of measurements: three times

Standby time before measurement: 0 seconds

Calibration: after zero calibration, white calibration (zero calibration: calibration in far space, white calibration: calibration with a white board for calibration)

The values obtained by the color measurement of the surface of each part were set as $L_1$, $a_1$, and $b_1$ and the values obtained by the color measurement of the surface plated with nickel chromium were set as $L_2$, $a_2$, and $b_2$. By using these values, the color difference ΔE between the colored layer and the surface plated with chromium was calculated using the following formula (1).

$$\Delta E = \sqrt{(L_1-L_2)^2 + (a_1-a_2)^2 + (b_1-b_2)^2} \quad \text{(Formula 1)}$$

The results are shown in Table 1.

Measurement of Thickness of Surface Layer

The thickness of the surface layer was measured by the XPS depth direction analysis using the aforementioned "sputtering conditions 1" and "XPS measurement conditions". The point where the difference of absolute value between the carbon atom concentration at a certain measurement point and the carbon atom concentration at a measurement point just prior to the certain measurement point became 1.0 at % or less was regarded as an end point of the surface layer. The sputtering time taken from the start of the sputtering to the end point is shown in Table 1.

Calculation of Oxidation Degree of Zr in Colored Layer

The oxidation degree of zirconium (Zr) in the colored layer was calculated using the ratio ($H_{Zr\ oxide}/H_{Zr}$) of the peak height of Zr oxide ($H_{Zr\ oxide}$) in the oxidized state to the peak height of Zr ($H_{Zr}$) obtained by the XPS measurement. Zr was confirmed by the presence of the peak around 180 eV, and Zr in the oxidized state was confirmed by the presence of the peak around 182 eV.

Oxidation Degree of Zr at Interface on Side of Surface Layer of Colored Layer

The oxidation degree of Zr at the interface of the colored layer on the side of the surface layer was obtained by the XPS depth direction analysis using the aforementioned "sputtering conditions 1" and "XPS measurement conditions". The oxidation degree was calculated from the Zr spectrum at the point where the peak of Zr was detected by 1.0 at % or more. The oxidation degree thus obtained at the interface of the colored layer on the side of the surface layer is shown in Table 1.

Oxidation Degree of Zr at Predetermined Depth from Interface of the Colored Layer on the Side of the Surface Layer The oxidation degree of Zr at a predetermined depth from the interface of the colored layer on the side of the surface layer was obtained from the following Zr spectrum. First, the XPS depth direction analysis using the aforementioned "sputtering conditions 1" and "XPS measurement conditions" was performed. The point where the Zr peak was detected by 1.0 at % or more was set as a start point. Thereafter, the oxidation degree was calculated based on the Zr spectrum at the point where Ar sputtering was performed for 5 minutes from the start point using the aforementioned "sputtering conditions 2", that is, at the point where the XPS depth direction analysis was performed for 5 minutes using the "sputtering conditions 2" and the "XPS measurement conditions." The obtained oxidation degree of Zr at the predetermined depth from the interface on the side of the surface layer is shown in Table 1.

Composition Analysis of Colored Layer

The composition of the colored layer was evaluated by the XPS depth direction analysis. First, the XPS depth direction analysis using the aforementioned "sputtering conditions 1" and "XPS measurement conditions" was performed. The point where the Zr peak was detected by 1.0 at % or more was set as a start point. Thereafter, the composition at the point where Ar sputtering was performed for 5 minutes using the aforementioned "sputtering conditions 2", that is, at the point where the XPS depth direction analysis was performed for 5 minutes using the "sputtering conditions 2" and the "XRS measurement conditions" was determined as the composition of the colored layer. The composition of the colored layer thus obtained is shown in Table 1.

Confirmation of Hydrophobic Group Contained in Surface Layer

By the following method, it was confirmed that the surface layer contained the alkyl group. It was confirmed using the surface enhanced Raman spectroscopy. As the surface enhanced Raman spectroscopy analyzer, the following analyzer was used. As the surface enhanced Raman sensor, a transmission-type surface enhanced Raman sensor described in Example 1 of JP 6179905 B was used. As the confocal microscope Raman spectrometer, NanoFinder30 (Tokyo Instruments Inc.) was used. In the measurement, the transmission-type surface enhanced Raman sensor was disposed on the surface of the cut-out part. The measurement conditions were such that Nd: YAG laser (532 nm, 1.2 mW), scan time (10 seconds), grating (800 Grooves/mm), and pinhole size (100 μm).

In Examples 1, 2, 5 to 7, 10, and 11, the signal peaks were detected in the Raman shifts 2850 cm$^{-1}$ and 2920 cm$^{-1}$ each derived from —$(CH_2)_n$— included in the alkyl chain. In Examples 3, 4, 8, 9, 12, and 13, the signal peaks were detected in the Raman shifts 735 cm$^{-1}$ and 1295 cm$^{-1}$ each derived from —$(CF_2)_n$— included in the alkyl chain in which parts of hydrogen atoms were substituted with fluorine.

TABLE 1

| Structure of part | | | | Example 1 | Example 2 | Example 3 | Example 4 | Example 5 | Example 6 | Example 7 | Example 8 |
|---|---|---|---|---|---|---|---|---|---|---|---|
| | Base material | | | Flat plate of brass + nickel chromium plating | same as on the left | same as on the left | same as on the left | same as on the left | same as on the left | same as on the left | same as on the left |
| | Colored layer | Color difference | $\Delta E$ | 26 | 20.2 | 26.6 | 19.3 | 25.6 | 27.6 | 19.2 | 27.6 |
| | | Composition (at %) | Zr | 52.3 | 40.9 | 50.8 | 36.4 | 50.1 | 54.4 | 42.0 | 47.8 |
| | | | C | 11.8 | 6.6 | 10.1 | 8.8 | 8.1 | 8.7 | 8.7 | 10.3 |
| | | | N | 22.2 | 31.3 | 21.3 | 34.0 | 24.0 | 21.0 | 30.3 | 23.8 |
| | | | (C + N) | 34.0 | 38.0 | 31.4 | 42.7 | 32.1 | 29.7 | 39.0 | 34.1 |

TABLE 1-continued

| | | | | | | | | | | | |
|---|---|---|---|---|---|---|---|---|---|---|---|
| | | | O | 13.4 | 14.9 | 17.6 | 14.6 | 17.7 | 15.8 | 13.4 | 17.5 |
| | | | Cr | 0.0 | 5.5 | 0.0 | 6.3 | 0.0 | 0.0 | 5.6 | 0.0 |
| | | | Ti | — | — | — | — | — | — | — | — |
| | | Oxidation degree of Zr at interface on the side of surface layer ($H_{Zr\ oxide}/H_{Zr}$) | | 3.1 | 3.0 | 2.8 | 2.0 | 3.7 | 3.6 | 2.7 | 2.9 |
| | | Oxidation degree of Zr at predetermined depth from interface on the side of surface layer ($H_{Zr\ oxide}/H_{Zr}$) | | 0.8 | 0.9 | 0.9 | 0.9 | 0.9 | 0.9 | 0.9 | 0.9 |
| | | Pre-treatment | | Neutral detergent | same as on the left | same as on the left | same as on the left | UV ozone treatment: 5 mins | Alkali treatment | same as on the left | UV ozone treatment: 5 mins |
| | Surface layer | Component or raw material | | Octadecyl-phosphonic acid | same as on the left | SURECO | same as on the left | Octadecyl-phosphonic acid | same as on the left | same as on the left | SURECO |
| | | Thickness (sputtering time, min) | | 1 | 1 | 3 | 2 | 1 | 1 | 1 | 3 |
| Evaluation of part | Surface properties | Water contact angle (°) | Initial | 100.9 | 100.4 | 113.5 | 112.5 | 102.8 | 101.6 | 101.8 | 112.5 |
| | | Scale removability | Initial | 5 times | 5 times | 5 times | 5 times | 5 times | 5 times | 5 times | 5 times |
| | | | After weather resistance test | 5 times | 5 times | 5 times | 5 times | 5 times | 5 times | 5 times | 10 times |

| | | | | Example 9 | Example 10 | Example 11 | Example 12 | Example 13 |
|---|---|---|---|---|---|---|---|---|
| Structure of part | | Base material | | same as on the left | same as on the left | same as on the left | same as on the left | same as on the left |
| | Colored layer | Color difference | ⊿E | 20.5 | 13.3 | 25.1 | 19.3 | 19.1 |
| | | Composition (at %) | Zr | 38.8 | 25.6 | 43.2 | 40.2 | 43.9 |
| | | | C | 5.2 | 11.6 | 13.7 | 13.4 | 12.4 |
| | | | N | 34.1 | 23.5 | 18.0 | 10.4 | 10.8 |
| | | | (C + N) | 39.3 | 35.0 | 31.7 | 23.8 | 23.2 |
| | | | O | 15.1 | 39.4 | 25.1 | 36.0 | 32.8 |
| | | | Cr | 6.8 | 0.0 | 0.0 | 0.0 | 0.0 |
| | | | Ti | — | — | — | — | — |
| | | Oxidation degree of Zr at interface on the side of surface layer ($H_{Zr\ oxide}/H_{zr}$) | | 2.2 | 3.0 | 2.8 | 4.0 | 3.7 |
| | | Oxidation degree of Zr at predetermined depth from interface on the side of surface layer ($H_{Zr\ oxide}/H_{zr}$) | | 0.9 | 1.4 | 0.9 | 1.0 | 0.9 |
| | | Pre-treatment | | Alkali treatment | Neutral detergent | same as on the left | UV ozone treatment: 10 mins | UV ozone treatment: 10 mins |
| | Surface layer | Component or raw material | | same as on the left | Octadecyl-phosphonic acid | same as on the left | Silane compound containing a perfluoropoly ether group | Perfluorodecyl-phosphonic acid |
| | | Thickness (sputtering time, min) | | 2 | 1 | 1 | 2 | 1 |
| Evaluation of part | Surface properties | Water contact angle (°) | Initial | 112.3 | 103.2 | 100.8 | 111.9 | 114.6 |
| | | Scale removability | Initial | 5 times | 5 times | 5 times | 5 times | 5 times |
| | | | After weather resistance test | 5 times | 5 times | 5 times | 5 times | 10 times |

TABLE 1-continued

|  |  |  |  | Comparative example 1 | Comparative example 2 | Comparative example 3 |
|---|---|---|---|---|---|---|
| Structure of part | | Base material | | same as on the left | same as on the left | same as on the left |
| | Colored layer | Color difference | $\Delta E$ | 29 | 20 | 15.4 |
| | | Composition (at %) | Zr | 48.8 | 39.2 | — |
| | | | C | 10.9 | 6.7 | 8.1 |
| | | | N | 22.7 | 30.1 | 33.0 |
| | | | (C + N) | 33.6 | 36.8 | 41.1 |
| | | | O | 17.6 | 18.6 | 23.9 |
| | | | Cr | 0.0 | 5.4 | 0.0 |
| | | | Ti | 0.0 | 5.4 | 0.0 |
| | | Oxidation degree of Zr at interface on the side of surface layer ($H_{Zr\ oxide}/H_{Zr}$) | | 4.8 | 4.5 | Not containing Zr |
| | | Oxidation degree of Zr at at predetermined depth from interface on the side of surface layer ($H_{Zr\ oxide}/H_{Zr}$) | | 0.9 | 0.9 | Not containing Zr |
| | | Pre-treatment | | UV ozone treatment: 30 mins | same as on the left | Neutral detergent |
| | Surface layer | Component or raw material | | same as on the left | same as on the left | same as on the left |
| | | Thickness (sputtering, time, min) | | 1 | 1 | 1 |
| Evaluation of part | Surface properties | Water content angle (°) | Initial | 102.4 | 103.5 | 101 |
| | | Scale removability | Initial | 5 times | 5 times | 5 times |
| | | | After weather resistance test | 40 times | 70 times | Not removed even after 100 times |

REFERENCE SIGNS LIST

1: Part
10: Base material
10a: Support member of Base material 10
10b: One region of Base material 10
20: Colored layer
30: Intermediate layer
40: Surface layer

The invention claimed is:

1. A part comprising a base material, a colored layer on the base material, and a surface layer on the colored layer, wherein
the colored layer contains Zr and optionally, C and/or N,
a ratio $H_{Zr\ oxide}/H_{Zr}$ of a peak height derived from Zr oxide $H_{Zr\ oxide}$ to a peak height of Zr $H_{Zr}$ at an interface of the colored layer on the side of the surface layer, in a profile obtained by an XPS depth direction analysis, is more than 0 and less than 4.5, the XPS depth direction analysis being performed under the following XPS measurement conditions and Sputtering conditions 1,
XPS measurement conditions
X-ray condition: monochromatic AlKα ray (output 25 W),
Photoelectron take-off angle: 45°,
Analysis area: 100 μmφ,
Charge neutralizer setting: 1.0 V, 10 μA,
Time per step: 50 ms,
Sweep: five times,
Pass energy: 112 eV, and
Element to be analyzed (energy range): Zr3d (177-187 eV), C1s (281-296 eV), N1s (394-406 eV), O1s (524-540 eV), Cr2p3 (572-582 eV), Ti2p (452-463 eV), Si2p (98-108 eV),
Sputtering conditions 1
Inert gas species: Ar,
Sputtering voltage: 500 V,
Sputtering range: 2 mm*2 mm, and
Sputtering cycle: 10 seconds, and
the ratio $H_{Zr\ oxide}/H_{Zr}$ at a point where Ar sputtering is performed for 5 minutes from the interface of the colored layer on the side of the surface layer with an XPS depth direction analysis is between 0 or more and less than 3, the XPS depth direction analysis being performed under said XPS measurement conditions and the following Sputtering conditions 2,
Sputtering conditions 2
Inert gas species: Ar
Sputtering voltage: 500 V
Sputtering range: 2 mm*2 mm
Sputtering cycle: 1 minute; and
the surface layer
is water-repellent, and
includes a hydrophobic group, and
exhibits a sputtering time of 5 minutes or less, the sputtering time being a time taken from the start of the sputtering to an end point of the surface layer, and the end point being defined, in a profile obtained by an XPS depth direction analysis of the surface layer, as a point where an absolute value of a difference between a carbon atom concentration at a certain measurement point and a carbon atom concentration at an immediately previous measurement point to the certain measurement point is 1.0 at % or less, the XPS depth direction analysis being performed under said XPS measurement conditions and said Sputtering conditions 1.

2. The part according to claim 1, wherein
the colored layer contains, at a point where Ar sputtering is performed for 5 minutes from the interface of the colored layer on the side of the surface layer with an XPS depth direction analysis,
15 at % or more to 65 at % or less of Zr,
10 at % or more to 40 at % or less of O,
25 at % or more to 45 at % or less of C and N, and 0 at % or more to 20 at % or less of a metal element (excluding Ti and Zr), on the proviso that a total of a combination of the Zr, O, C and N, and the metal element (excluding Ti and Zr) is 100 at %, the XPS depth direction analysis being performed under said XPS measurement conditions and said Sputtering conditions 2.

3. The part according to claim 1, wherein the colored layer comprises an oxide film with a thickness of less than 30 nm.

4. The part according to claim 1, wherein the surface layer is a monolayer, and has a sputtering time of 3 minutes or less, the sputtering time being a time taken from the start of the sputtering to an end point of the surface layer, and the end point being defined, in a profile obtained by an XPS depth direction analysis of the surface layer, as a point where an absolute value of a difference between a carbon atom concentration at a certain measurement point and a carbon atom concentration at an immediately previous measurement point to the certain measurement point is 1.0 at % or less, the XPS depth direction analysis being performed under said XPS measurement conditions and said Sputtering conditions 1.

5. The part according to claim 1, wherein the ratio $H_{Zr\ oxide}/H_{Zr}$ of the peak height derived from Zr oxide $H_{Zr\ oxide}$ to the peak height of Zr $H_{Zr}$ at the interface of the colored layer on the side of the surface layer is 2 or more and 4 or less, and the ratio $H_{Zr\ oxide}/H_{Zr}$ at the point where Ar sputtering is performed for 5 minutes from the interface of the colored layer on the side of the surface layer with an XPS depth direction analysis is between 0.5 or more and less than 1.5.

6. The part according to claim 1, wherein the colored layer contains, at a point where Ar sputtering is performed for 5 minutes from the interface of the colored layer on the side of the surface layer with an XPS depth direction analysis, 25 at % or more to 55 at % or less of Zr, 10 at % or more to 40 at % or less of O, 25 at % or more to 45 at % or less of C and N, and 0 at % or more to 10 at % or less of a metal element (excluding Ti and Zr), on the proviso that a total of a combination of the Zr, O, C and N, and the metal element (excluding Ti and Zr) is 100 at %, the XPS depth direction analysis being performed under said XPS measurement conditions and said Sputtering conditions 2.

7. The part according to claim 1, wherein the part is used as a faucet, or a part constituting a toilet, or a part constituting a bathroom.

8. The part according to claim 2, wherein the colored layer comprises an oxide film with a thickness of less than 30 nm.

9. The part according to claim 2, wherein the surface layer is a monolayer, and has a sputtering time of 3 minutes or less, the sputtering time being a time taken from the start of the sputtering to an end point of the surface layer, and the end point being defined, in a profile obtained by an XPS depth direction analysis of the surface layer, as a point where an absolute value of a difference between a carbon atom concentration at a certain measurement point and a carbon atom concentration at an immediately previous measurement point to the certain measurement point is 1.0 at % or less, the XPS depth direction analysis being performed under said XPS measurement conditions and said Sputtering conditions 1.

10. The part according to claim 2, wherein the ratio $H_{Zr\ oxide}/H_{Zr}$ of the peak height derived from Zr oxide $H_{Zr\ oxide}$ to the peak height of Zr $H_{Zr}$ at the interface of the colored layer on the side of the surface layer is 2 or more and 4 or less, and the ratio $H_{Zr\ oxide}/H_{Zr}$ at the point where Ar sputtering is performed for 5 minutes from the interface of the colored layer on the side of the surface layer with an XPS depth direction analysis is between 0.5 or more and less than 1.5.

11. The part according to claim 2, wherein the colored layer contains, at a point where Ar sputtering is performed for 5 minutes from the interface of the colored layer on the side of the surface layer with an XPS depth direction analysis, 25 at % or more to 55 at % or less of Zr, 10 at % or more to 40 at % or less of O, 25 at % or more to 45 at % or less of C and N, and 0 at % or more to 10 at % or less of a metal element (excluding Ti and Zr), on the proviso that a total of a combination of the Zr, O, C and N, and the metal element (excluding Ti and Zr) is 100 at %, the XPS depth direction analysis being performed under said XPS measurement conditions and said Sputtering conditions 2.

12. The part according to claim 2, wherein the part is used as a faucet, or a part constituting a toilet, or a part constituting a bathroom.

13. The part according to claim 3, wherein the surface layer is a monolayer, and has a sputtering time of 3 minutes or less, the sputtering time being a time taken from the start of the sputtering to an end point of the surface layer, and the end point being defined, in a profile obtained by an XPS depth direction analysis of the surface layer, as a point where an absolute value of a difference between a carbon atom concentration at a certain measurement point and a carbon atom concentration at an immediately previous measurement point to the certain measurement point is 1.0 at % or less, the XPS depth direction analysis being performed under said XPS measurement conditions and said Sputtering conditions 1.

14. The part according to claim 3, wherein the ratio $H_{Zr\ oxide}/H_{Zr}$ of the peak height derived from Zr oxide $H_{Zr\ oxide}$ to the peak height of Zr $H_{Zr}$ at the interface of the colored layer on the side of the surface layer is 2 or more and 4 or less, and the ratio $H_{Zr\ oxide}/H_{Zr}$ at the point where Ar sputtering is performed for 5 minutes from the interface of the colored layer on the side of the surface layer with an XPS depth direction analysis is between 0.5 or more and less than 1.5.

15. The part according to claim 3, wherein the colored layer contains, at a point where Ar sputtering is performed for 5 minutes from the interface of the colored layer on the side of the surface layer with an XPS depth direction analysis, 25 at % or more to 55 at % or less of Zr, 10 at % or more to 40 at % or less of O, 25 at % or more to 45 at % or less of C and N, and 0 at % or more to 10 at % or less of a metal element (excluding Ti and Zr), on the proviso that a total of a combination of the Zr, O, C and N, and the metal element (excluding Ti and Zr) is 100 at %, the XPS depth direction analysis being performed under said XPS measurement conditions and said Sputtering conditions 2.

16. The part according to claim 4, wherein
the ratio $H_{Zr\ oxide}/H_{Zr}$ of the peak height derived from Zr oxide $H_{Zr\ oxide}$ to the peak height of Zr $H_{Zr}$ at the interface of the colored layer on the side of the surface layer is 2 or more and 4 or less, and the ratio $H_{Zr\ oxide}/H_{Zr}$ at the point where Ar sputtering is performed for 5 minutes from the interface of the colored layer on the side of the surface layer with an XPS depth direction analysis is between 0.5 or more and less than 1.5.

17. The part according to claim 4, wherein
the colored layer contains, at a point where Ar sputtering is performed for 5 minutes from the interface of the colored layer on the side of the surface layer with an XPS depth direction analysis,
25 at % or more to 55 at % or less of Zr,
10 at % or more to 40 at % or less of O,
25 at % or more to 45 at % or less of C and N, and
0 at % or more to 10 at % or less of a metal element (excluding Ti and Zr), on the proviso that
a total of a combination of the Zr, O, C and N, and the metal element (excluding Ti and Zr) is 100 at %, the XPS depth direction analysis being performed under said XPS measurement conditions and said Sputtering conditions 2.

18. The part according to claim 5, wherein
the colored layer contains, at a point where Ar sputtering is performed for 5 minutes from the interface of the colored layer on the side of the surface layer with an XPS depth direction analysis,
25 at % or more to 55 at % or less of Zr,
10 at % or more to 40 at % or less of O,
25 at % or more to 45 at % or less of C and N, and
0 at % or more to 10 at % or less of a metal element (excluding Ti and Zr), on the proviso that
a total of a combination of the Zr, O, C and N, and the metal element (excluding Ti and Zr) is 100 at %, the XPS depth direction analysis being performed under said XPS measurement conditions and said Sputtering conditions 2.

* * * * *